US005587588A

United States Patent [19]

Kim

[11] Patent Number: 5,587,588

[45] Date of Patent: Dec. 24, 1996

[54] MULTIPLE MICRO-TIPS FIELD EMISSION DEVICE

[75] Inventor: Jong-min Kim, Seoul, Rep. of Korea

[73] Assignee: Samsung Display Devices Co., Ltd., Suwon-city, Rep. of Korea

[21] Appl. No.: 509,603

[22] Filed: Jul. 31, 1995

[30] Foreign Application Priority Data

Mar. 28, 1995 [KR] Rep. of Korea ........................ 95-6748

[51] Int. Cl.[6] ............................. H01L 29/06; H01J 1/46; H01J 21/10

[52] U.S. Cl. ........................... 257/10; 313/306; 313/308; 313/311

[58] Field of Search ............................. 257/10, 350, 577, 257/632; 313/308, 309, 336, 351, 431, 531, 306, 311

[56] References Cited

U.S. PATENT DOCUMENTS 5,420,054 5/1995 Choi et al. ................................ 257/10
5,449,970 9/1995 Kumar et al. ........................... 313/309

*Primary Examiner*—Carl Whitehead, Jr.
*Attorney, Agent, or Firm*—Foley & Lardner

[57] ABSTRACT

A multiple micro-tips field emission device includes a substrate, an adhesion layer formed on the substrate, a cathode formed in stripes on the adhesion layer, an insulation layer formed on the substrate on which the cathode is formed and having a hole formed therein, micro-tips for field emission, being multiply formed on the cathode in the hole, and a gate electrode formed on the insulation layer in stripes across the cathode and having an aperture for field emission from the micro-tips. The adjustment of the tip size is optionally available during the process. Also, the output current can be controlled in a wide range from nA to mA because of the multiple micro-tips. By forming the tips with tungsten, the device has good strength, oxidation characteristics and work function and has good electrical, chemical and mechanical endurance.

16 Claims, 3 Drawing Sheets

MULTIPLE MICRO-TIPS FIELD EMISSION DEVICE

BACKGROUND OF THE INVENTION

The present invention relates to a field emission device, and more particularly to a multiple micro-tips field emission device in which the uniformity of emitted current is improved so as to be used for a flat panel display.

Recently, flat image display devices have been actively developed as a replacement for the CRT (cathode ray tube) of conventional T.V. sets, in particular their use in wall-mounted (tapestry) television and high definition television (HDTV). Flat image display devices include liquid crystal display devices, plasma display panels and field emission devices. Among these, the field emission device is being concentrated on due to its image brightness and low power-consumption.

Referring to FIG. 1, the structure of a conventional field emission device is described.

The field emission device includes a glass substrate 1, a cathode 2 formed on glass substrate 1 in stripes, a micro-tip 4 for field-emission formed on cathode 2 in an array structure, an insulation layer 3 formed on cathode 2 to surround micro-tip 4, and a gate electrode 5 formed on insulation layer 3 in stripes perpendicular to cathode 2 and having a gate aperture 6 over micro-tip 4 for field emission.

To fabricate field emission device of the above structure, it is necessary to form a nanometer-sized micro-tip array. Therefore, fine processing of a submicron unit is required in the gate aperture etching process so that the gate having a precise aperture size, considering the micro-tip size (radius) can be formed, because, without such a fine processing, the gate aperture is too large, whereby a high driving bias voltage is required and the tip radius itself can affect uniformity of the flat panel display device. That is, the micro-tip radius must be under 200 Å, and the gap between the gate and the micro-tip must be within submicrons.

In the actual manufacturing process, nonuniformity of film thickness, nonuniformity in the micro-tip forming process and difficulty in a layer parting process remain problematic. This problem causes nonuniformity of luminance when the field emission display device is used as the flat panel display device, and nonuniformity of current emission amount when used as a very high frequency device. Particularly, since the array of a plurality of micro-tips must be fabricated uniformly in a device requiring large current emission, such as is used in a very high frequency amplifier or other electron beam-applied apparatus, a high yield cannot be obtained in the fabrication process because of the nonuniformity problem.

SUMMARY OF THE INVENTION

To solve the above problems, it is an object of the present invention to provide a multiple micro-tips field emission device which can uniformly emit electrons.

Accordingly, to achieve the above object, there is provided a multiple micro-tips field emission device comprising: a substrate; an adhesion layer formed on the substrate; a cathode formed in stripes on the adhesion layer; an insulation layer formed on the adhesion layer and the cathode and having a hole formed therein; micro-tips for field emission, being multiply formed on the cathode in the hole; and a gate electrode formed on the insulation layer in stripes across the cathode and having an aperture for field emission from the micro-tips.

In the present invention, it is preferable that the adhesion layer is formed by depositing titanium and aluminum to a thickness of about 2000 Å, that the cathode is formed by depositing tungsten to a thickness of about 1 μm, that the insulation layer is formed by growing $SiO_2$ to a thickness of about 1 μm, and that the gate electrode layer is made of chromium.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
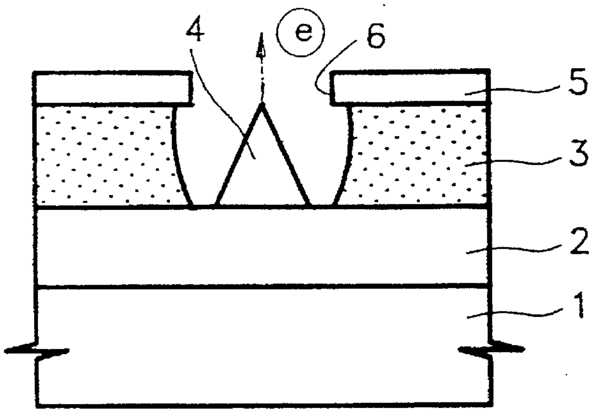
FIG. 1(PRIOR ART)
FIG. 1 is a section illustrating a conventional field emission device.
Figure 2:
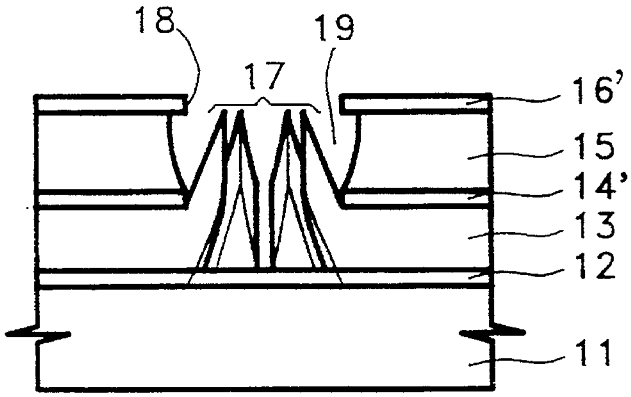
FIG. 2 is a section illustrating a multiple micro-tips field emission device according to the present invention.

Referring to FIG. 2, a multiple micro-tips field emission device according to the present invention comprises a substrate 11, an adhesion layer 12 formed on substrate 11, a cathode 13 formed on adhesion layer 12 in stripes, multiple micro-tips 17 formed by etching a predetermined part of cathode 13 in an array form such that the etched part is radially lifted up, an insulation layer 15 formed to surround the multiple micro-tips 17, and a gate electrode layer 16' formed on insulation layer 15 having an aperture for field-emission from the multiple micro-tips. Here, mask 14' is for the fabrication of the micro-tips.

In the multiple micro-tips field emission device of such a structure, the output current can be controlled in a wide range of nA-mA because of the multiple micro-tips. The micro-tips is preferably formed of tungsten. In this case the device has relatively better strength, oxidation characteristics and work function and has good electrical, chemical and mechanical endurance. The geometrical feature of the multiple tungsten micro-tips is determined by the intrinsic stress of the tungsten cathode layer.

In a completed field emission device of the above construction, when a voltage of between 10 to 100 V is applied with a vacuum of $10^{-6}$ to $10^{-7}$ Torr and a positive gate voltage, and a negative or grounded cathode voltage, electrons are emitted from the micro-tips with a strong electrical field. Here, the electron emission degree is controlled by the number of micro-tips according to the tungsten pattern and the distance between the gate electrode and the tip end. Since high-current emission is possible in a single gate aperture pattern with the multiple micro-tips, the device can be used as the flat panel display device, a high-output microwave device, an electron-beam applied scanning electron microscopy (SEM), an electron-beam applied system device and a pressure sensor using multiple beam emission.

Figure 3A:
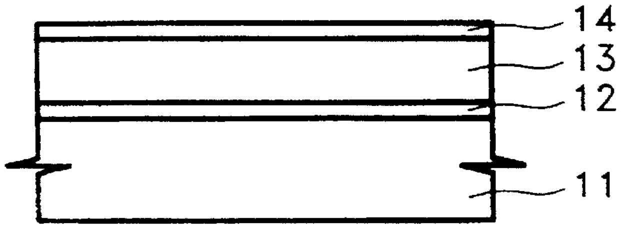
FIGS. 3A to 3H are sections illustrating fabrication sequence of the multiple micro-tips field emission device according to the present invention.
Figure 3B:
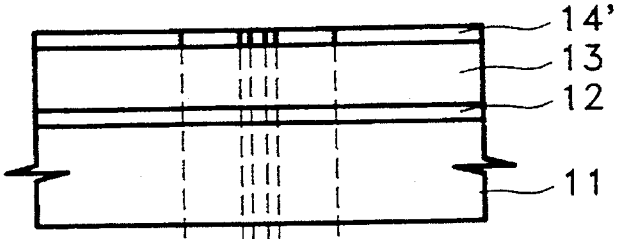
Figure 3C:
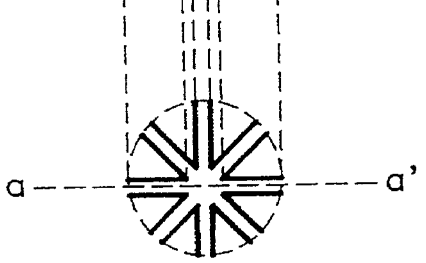

Referring to FIGS. 3A to 3H, the fabricating process of the multiple micro-tips field emission device having the above structure, is described hereinafter. FIG. 3C is a plan view of the aluminum mask.

As shown in FIG. 3A, a titanium adhesion layer 12 with a thickness of about 2000 Å is deposited on substrate 11. Then, tungsten is deposited to a thickness of about 1 μm and cathode 13 is formed by etching the deposited tungsten layer. Aluminum is then deposited using an electron-beam so as to form an aluminum layer 14.

Referring to FIG. 3B, a mask 14' for forming multiple micro-tips is formed by etching the aluminum layer 14 by photolithography. Mask 14' is etched radially to form the shape shown in FIG. 3C. Alternatively, mask 14' may be formed using a lift-off method. Here, FIG. 3B is a section taken along the line a–a' in FIG. 3C.

Figure 3D:
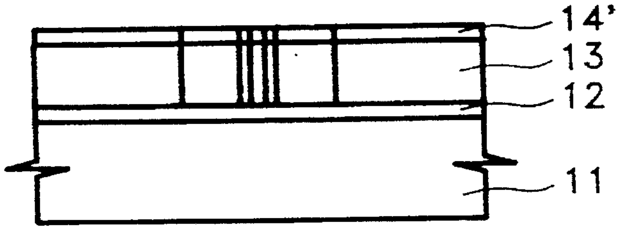

Next, as shown in FIG. 3D, the tungsten cathode 13 is radially etched using aluminum mask 14', by an RIE (reactive ion etching) method using $CF_4/O_2$ plasma, to form triangular parts corresponding to the multiple micro-tips.

Figure 3E:
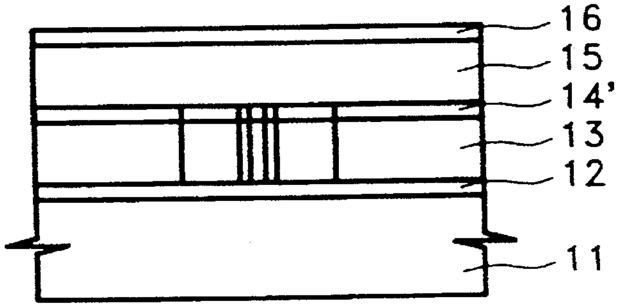

In FIG. 3E, an insulation layer 15 is deposited using $SiO_2$ to a thickness of about 1 μm on the substrate on which the aluminum mask 14' is formed. Then, a gate electrode layer 16 is formed by depositing Cr onto the $SiO_2$ layer and gate electrodes 16' are formed by etching the Cr layer in stripes perpendicular to cathode 13. The gates 16' may be formed using the lift-off method.

Figure 3F:
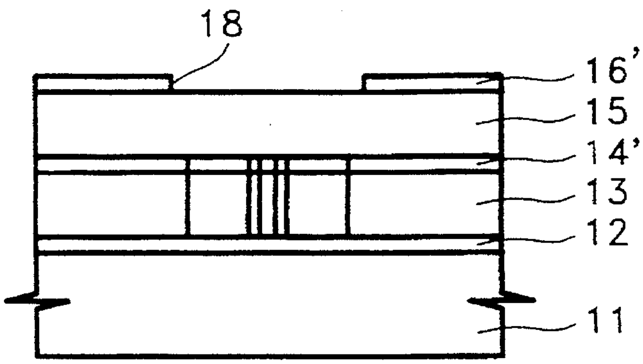

In FIG. 3F, an aperture 18 is formed in Cr gate 16' for passing electrons therethrough.

Figure 3G:
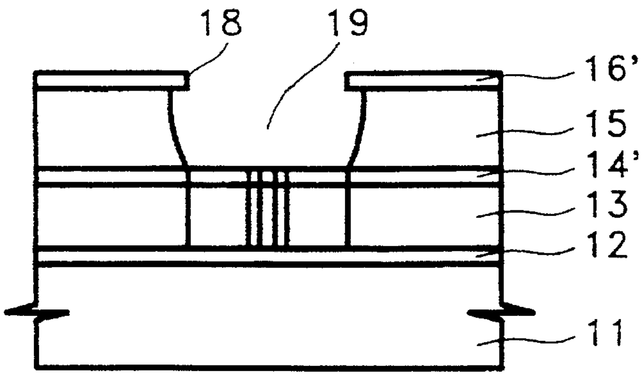

In FIG. 3G, a hole 19 is formed by etching insulation layer 15 through aperture 18 of gate 16' using the RIE method.

Figure 3H:
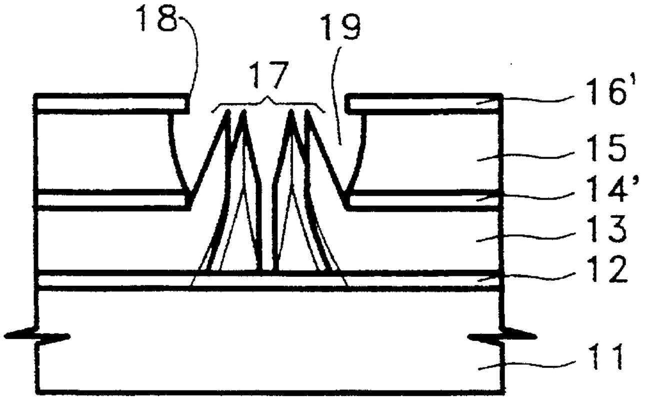

In FIG. 3H, the multiple micro-tips are formed by selectively etching the titanium adhesion layer 12 using a BOE (buffer oxide etching) method to complete the device. At this time, the etching rate (etching speed) of titanium adhesion layer 12 is very fast in order to etch in a short time, so that multiple triangular shaped micro-tips are lifted up from the tungsten cathode due to its internal stress. In the above process, it is important to control the etching speed precisely since the etching speed is very fast.

In the BOE method, the etching solution used has a ratio of HF to $NH_4F$ from 7:1 to 10:1.

As described above, the multiple micro-tips field emission device is fabricated by forming the titanium adhesion layer onto which the tungsten cathode is formed in stripes, and etching the tungsten cathode radially and selectively etching the titanium adhesion layer so that the multiple micro-tips are formed due to the intrinsic internal stress of the tungsten cathode. Therefore, in the multiple micro-tips field emission device according to the present invention, the tip size can be optionally adjusted in the process. Also, the output current can be controlled in a wide range from nA to mA of the multiple micro-tips. Further, by forming the multiple micro-tips using tungsten, the device has better strength, oxidation characteristics and work function and has a good electrical, chemical and mechanical endurance.

What is claimed is:

1. A field emission device, comprising:

a substrate;

an adhesion layer disposed on the substrate;

a cathode having a striped pattern disposed on the adhesion layer;

an insulation layer having a hole therein disposed above the cathode;

a plurality of micro-tips disposed on the cathode; and a gate electrode, having an aperture defined around the micro-tips, and having a stripe pattern perpendicular to the striped pattern of the cathode, disposed on the insulation layer.

2. A field emission device as recited in claim 1, wherein the adhesion layer is comprised of titanium and aluminum.

3. A field emission device as recited in claim 1, wherein the cathode is comprised of tungsten.

4. A field emission device as recited in claim 1, wherein the insulation layer is comprised of $SiO_2$.

5. A field emission device as recited in claim 1, wherein the gate electrode is comprised of chromium.

6. A field emission device as recited in claim 1, wherein the adhesion layer is comprised of one of titanium and aluminum.

7. A field emission device as recited in claim 1, further comprising a masking layer between the cathode and the insulation layer.

8. A field emission device as recited in claim 7, wherein the masking layer is comprised of aluminum.

9. A field emission device, comprising:

a substrate;

an adhesion layer disposed on the substrate;

a cathode having a striped pattern disposed on the adhesion layer;

an insulation layer having a hole therein disposed above the cathode;

a plurality of micro-tips integrally formed on the cathode; and a gate electrode, having an aperture defined around the micro-tips and having a striped pattern perpendicular to the striped pattern of the cathode, disposed on the insulation layer.

10. A field emission device as recited in claim 9, wherein the adhesion layer is comprised of titanium and aluminum.

11. A field emission device as recited in claim 9, wherein the cathode is comprised of tungsten.

12. A field emission device as recited in claim 9, wherein the insulation layer is comprised of $SiO_2$.

13. A field emission device as recited in claim 9, wherein the gate electrode is comprised of chromium.

14. A field emission device as recited in claim 9, wherein the adhesion layer is comprised of one of titanium and aluminum.

15. A field emission device as recited in claim 9, further comprising a masking layer between the cathode and the insulation layer.

16. A field emission device as recited in claim 15, wherein the masking layer is comprised of aluminum.

* * * * *